US012807479B2

(12) United States Patent
Chang et al.

(10) Patent No.: US 12,807,479 B2
(45) Date of Patent: Nov. 24, 2026

(54) MEMS MICROPHONE AND METHOD FOR MANUFACTURING THE SAME

(71) Applicant: United Microelectronics Corp., Hsinchu (TW)

(72) Inventors: Jung-Hao Chang, Taoyuan City (TW); Shih-Wei Li, Taoyuan City (TW); Chang-Sheng Hsu, Hsinchu City (TW); Weng-Yi Chen, Hsinchu County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 177 days.

(21) Appl. No.: 18/810,570

(22) Filed: Aug. 21, 2024

(65) Prior Publication Data

US 2026/0028220 A1 Jan. 29, 2026

(30) Foreign Application Priority Data

Jul. 23, 2024 (TW) ................................ 113127473

(51) Int. Cl.

*B81B 3/00* (2006.01)
*B81C 1/00* (2006.01)
*H04R 7/14* (2006.01)

(52) U.S. Cl.

CPC ........ *B81B 3/0078* (2013.01); *B81C 1/00158* (2013.01); *H04R 7/14* (2013.01); (Continued)

(58) Field of Classification Search

CPC ...... B41J 2/1632; B81B 3/001; B81B 3/0021; B81B 3/0051; B81B 3/0078; B81B 2201/0257; B81B 2203/0127; B81B 2203/0315; B81B 7/02; B81C 1/00158; B81C 1/00658; B81C 2201/0105; B81C 2201/0123; B81C 2201/014; B81C 2201/0198; F01D 15/10; H04R 7/14; H04R 7/18; H04R 19/005; H04R 19/04; H04R 31/003; H04R 1/2842; H04R 9/025; H04R 17/00; G10K 13/00

See application file for complete search history.

(56) References Cited

U.S. PATENT DOCUMENTS 5,570,429 A * 10/1996 Paddock ................ H04R 7/127 381/423
5,721,786 A * 2/1998 Carrington ........... H04R 1/2842 381/423
(Continued)

FOREIGN PATENT DOCUMENTS

TW 202425663 A 6/2024

OTHER PUBLICATIONS

Office Action issued by Taiwan Intellectual Property Office on Oct. 27, 2025.

*Primary Examiner* — Gerald Gauthier
(74) *Attorney, Agent, or Firm* — WPAT, PC

(57) ABSTRACT

A MEMS microphone is provided. The MEMS microphone includes a substrate, a membrane, and a backplate. The substrate is with a cavity. The membrane is disposed on the substrate across the cavity. The backplate is disposed over the membrane and separated from the membrane by an air gap. The membrane has a corrugation. The backplate has a portion corresponding to and directly above the corrugation. A step height of the portion is equal to or less than 20% of a step height of the corrugation.

6 Claims, 19 Drawing Sheets

(52) U.S. Cl.
CPC ................. *B81B 2201/0257* (2013.01); *B81B 2203/0127* (2013.01); *B81B 2203/0315* (2013.01); *B81C 2201/0105* (2013.01); *B81C 2201/0123* (2013.01); *B81C 2201/014* (2013.01); *B81C 2201/0198* (2013.01)

(56) References Cited

U.S. PATENT DOCUMENTS 6,851,513 B2 * 2/2005 Stead ..................... G10K 13/00 181/173
9,913,040 B2 3/2018 Zhao et al.
10,405,118 B2 9/2019 Dehe et al.
10,841,711 B2 11/2020 Sun
2002/0041694 A1 * 4/2002 Michiels ................ H04R 17/00 381/423
2005/0013461 A1 * 1/2005 Milot ..................... H04R 9/025 381/430
2006/0082256 A1 * 4/2006 Bibl ....................... B41J 2/1632 257/E27.006
2008/0075308 A1 3/2008 Wei et al.
2010/0183187 A1 * 7/2010 Corynen .................. H04R 7/14 381/423
2012/0091546 A1 * 4/2012 Langereis ................ H04R 7/18 257/416
2013/0264663 A1 * 10/2013 Dehe ..................... B81B 3/0051 257/416
2015/0024536 A1 * 1/2015 Dehe .................... H04R 19/005 438/51
2015/0145079 A1 * 5/2015 Dehe .................... H04R 31/003 257/416
2015/0274506 A1 * 10/2015 Feyh ......................... B81B 7/02 257/416
2018/0002167 A1 * 1/2018 Frischmuth ......... B81C 1/00658
2019/0020962 A1 * 1/2019 Deas .................... H04R 19/005
2020/0021920 A1 * 1/2020 Sun .......................... B81B 3/001
2023/0032424 A1 * 2/2023 Yoo ........................ B81B 3/0021
2026/0028220 A1 * 1/2026 Chang ................... B81B 3/0078

* cited by examiner

MEMS MICROPHONE AND METHOD FOR MANUFACTURING THE SAME

This application claims the benefit of Taiwan application Serial No. 113127473, filed on Jul. 23, 2024, the subject matter of which is incorporated herein by reference.

TECHNICAL FIELD

This disclosure relates to a micro-electro-mechanical systems (MEMS) microphone and a method for manufacturing the same. More particularly, the disclosure relates to a MEMS microphone with a corrugation in the membrane and a method for manufacturing the same.

BACKGROUND

MEMS microphones are small microphone devices manufactured using semiconductor processes with sizes from several micrometers to several millimeters. Typically, a MEMS microphone comprises a membrane and a backplate. The membrane is very thin such that it can vibrate in response to sound waves. The backplate is disposed opposite to the membrane. When the membrane vibrates, the distance from the membrane to the backplate changes, and thus a capacitance between the membrane and the backplate changes. Therefore, the sound waves can be converted into electrical signals. A corrugation may be formed in the membrane to improve sensitivity of the device. However, due to the manufacturing processes, a step height of the corrugation may be transferred to and form a sharp profile on the backplate formed subsequently. As such, a weak point where stress concentrates may be generated at the backplate, and cause damage of the device.

SUMMARY

The disclosure is directed to solve or at least mitigate the problem as described above.

In one aspect of the disclosure, a MEMS microphone is provided. The MEMS microphone comprises a substrate, a membrane, and a backplate. The substrate is with a cavity. The membrane is disposed on the substrate across the cavity. The backplate is disposed over the membrane and separated from the membrane by an air gap. The membrane has a corrugation. The backplate has a portion corresponding to and directly above the corrugation. A step height of the portion is equal to or less than 20% of a step height of the corrugation.

In another aspect of the disclosure, a method for manufacturing a MEMS microphone is provided. The method comprises following steps. First, a membrane is formed on a substrate. The membrane has a corrugation. Then, a stop layer is formed on the membrane. The stop layer has an opening exposing the corrugation. A temporary filling material is filled through the opening of the stop layer into the corrugation. A backplate is formed over the temporary filling material and the membrane.

According to the disclosure, a filling process for the corrugation of the membrane is conducted before the formation of the backplate. As such, a MEMS microphone having a corrugation in the membrane but substantially having no stress concentration point caused due to the process transformation being formed in the backplate can be provided.

Figure 1:
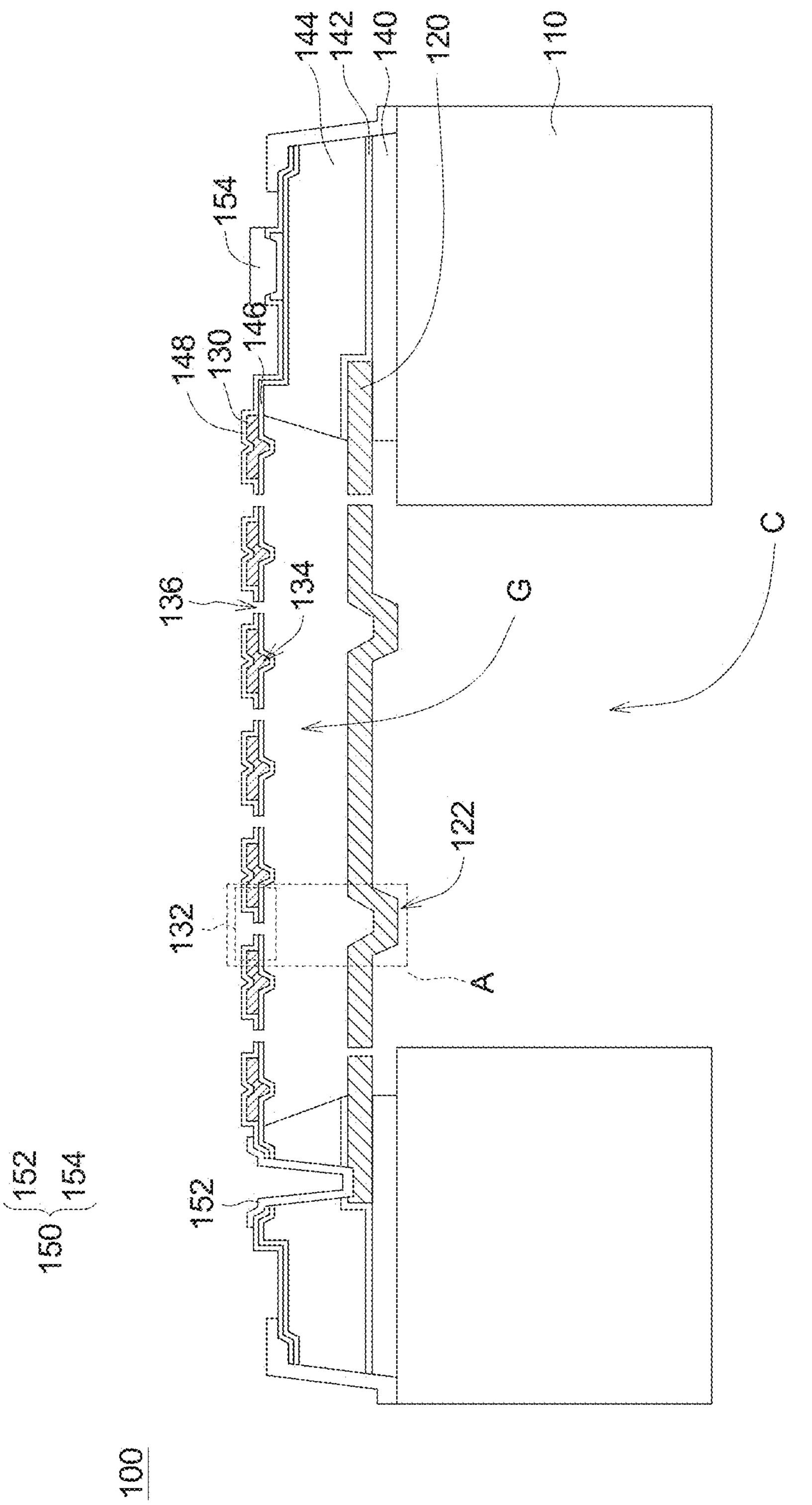
FIG. 1 illustrates a MEMS microphone according to the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Various embodiments will be described more fully hereinafter with reference to accompanying drawings. The description and the drawings are provided for illustrative only, and not intended to result in a limitation. As used herein, the singular forms are intended to include the plural forms as well, unless the context clearly indicates otherwise. In addition, the elements may not be drawn to scale for clarity. Some elements and/or reference numerals may be omitted from some drawings. It is contemplated that the elements and features of one embodiment can be beneficially incorporated in another embodiment without further recitation.

Referring to FIG. 1, a MEMS microphone 100 according to the disclosure is shown. The MEMS microphone 100 comprises a substrate 110, a membrane 120, and a backplate 130. The substrate 110 is with a cavity C. The membrane 120 is disposed on the substrate 110 across the cavity C. The backplate 130 is disposed over the membrane 120 and separated from the membrane 120 by an air gap G. The membrane 120 has a corrugation 122. The backplate 130 has a portion 132 corresponding to and directly above the corrugation 122. A step height of the portion 132 is equal to or less than 20% of a step height of the corrugation 122.

Specifically, a material of the substrate 110 may be, for example, Si. However, the disclosure is not limited thereto. The cavity C penetrates through the substrate 110.

According to some embodiments, the MEMS microphone 100 may further comprise a dielectric layer 140. The dielectric layer 140 is disposed on the substrate 110. A material of the dielectric layer 140 may be, for example, oxide. A thickness of the dielectric layer 140 may be, for example, 2,000 Å to 10,000 Å. However, the disclosure is not limited thereto. In conditions that the dielectric layer 140 is included, the cavity C penetrates through the dielectric layer 140 and the substrate 110.

Figure 2:
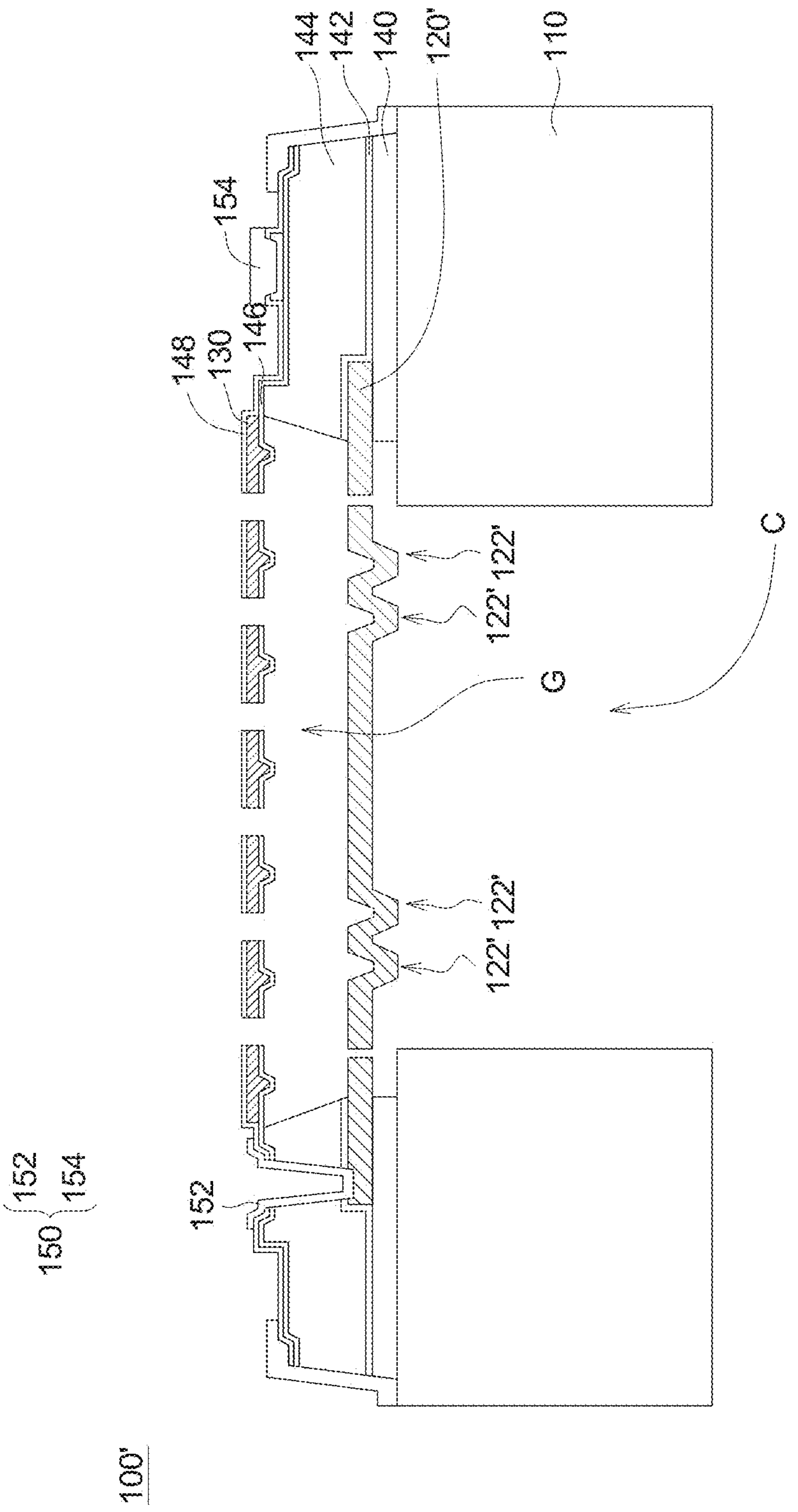
FIG. 2 illustrates another MEMS microphone according to the disclosure.

In conditions that the dielectric layer 140 is included, the membrane 120 is disposed on the dielectric layer 140. A material of the membrane 120 may be, for example, polysilicon. A thickness of the membrane 120 may be, for example, 2,000 Å to 10,000 Å. However, the disclosure is not limited thereto. The corrugation 122 of the membrane 120 is beneficial for improving sensitivity of the MEMS microphone 100. In the MEMS microphone 100 as shown in FIG. 1, the membrane 120 comprise one corrugation 122. However, it can be understood that the membrane 120 may comprise two or more of the corrugations. For example, in the MEMS microphone 100' as shown in FIG. 2, the membrane 120' comprises two corrugations 122'.

According to some embodiments, the MEMS microphone 100 may further comprise a dielectric layer 142. The dielectric layer 142 is disposed on a portion of the membrane 120 that is not exposed by the air gap G and on the dielectric layer 140. A material of the dielectric layer 142 may be, for example, TEOS. A thickness of the dielectric layer 142 may be, for example, 1,000 Å to 2,000 Å. However, the disclosure is not limited thereto.

According to some embodiments, the MEMS microphone 100 may further comprise a dielectric layer 144, which supports the overlying backplate 130 around the air gap G. The dielectric layer 144 is disposed on the dielectric layer 142. A material of the dielectric layer 144 may be, for example, oxide. A thickness of the dielectric layer 144 may be, for example, 15,000 Å to 30,000 Å. However, the disclosure is not limited thereto. The air gap G can actually be understood as the hollow part of the dielectric layer 144.

The backplate 130 is supported on the dielectric layer 144. A material of the backplate 130 may be, for example, polysilicon. A thickness of the backplate 130 may be, for example, 1,000 Å to 4,000 Å. However, the disclosure is not limited thereto. The backplate 130 may comprise a plurality of dimples 134. The dimples 134 face the membrane 120. The backplate 130 may comprise a plurality of acoustic holes 136. The acoustic holes 136 penetrate through the backplate 130. According to some embodiments, the MEMS microphone 100 may further comprise a dielectric layer 146 on a bottom side of the backplate 130. A material of the dielectric layer 146 may be, for example, silicon nitride. A thickness of the dielectric layer 146 may be, for example, 1,000 Å to 3,000 Å. However, the disclosure is not limited thereto. According to some embodiments, the MEMS microphone 100 may further comprise a protective layer 148 on a top side of the backplate 130. A material of the protective layer 148 may be, for example, silicon nitride. A thickness of the protective layer 148 may be, for example, 1,000 Å to 3,000 Å. However, the disclosure is not limited thereto.

Figure 3A:
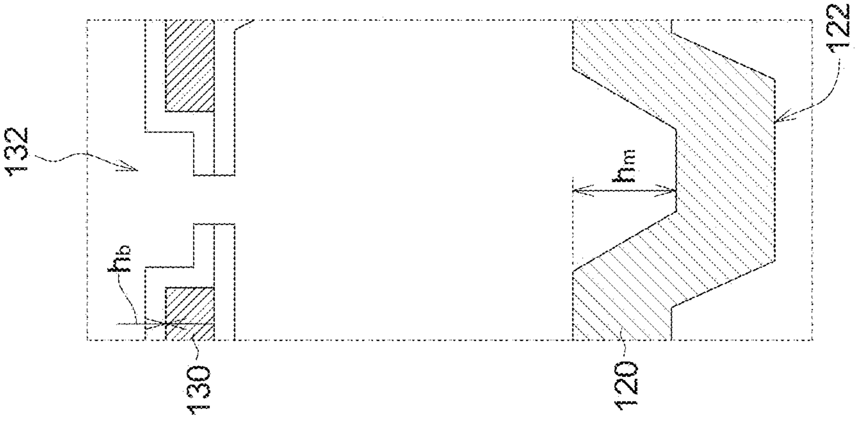
FIGS. 3A-3B illustrate details of the MEMS microphone according to the disclosure.

Referring to FIG. 3A, an enlarged view of the corrugation 122 of the membrane 120 and the corresponding portion 132 of the backplate 130 is shown. According to some embodiments, as shown in FIG. 3A, the step height $h_b$ of the portion 132 can be a vertical distance between a highest point and a lowest point of a top surface of the backplate 130, and the step height $h_m$ of the corrugation 122 can be a vertical distance between a highest point and a lowest point of a top surface of the membrane 120. The backplate 130 may be substantially flat at the portion 132. In other words, the step height $h_b$ of the portion 132 may be zero. The highest point of the membrane 120 at the corrugation 122 can be at the flat part of the membrane 120, and the lowest portion can be at the deepest part of the corrugation 122.

Figure 3B:
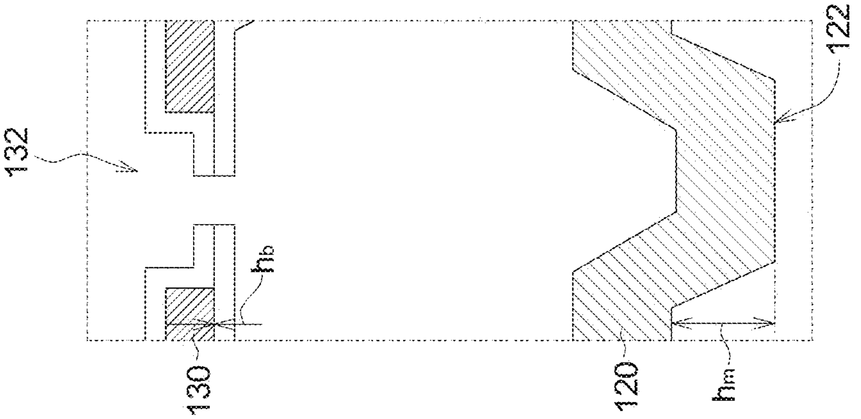

According to some other embodiments, as shown in FIG. 3B, the step height $h_b$ of the portion 132 can be a vertical distance between a highest point and a lowest point of bottom surface of the backplate 130, and the step height $h_m$ of the corrugation 122 can be a vertical distance between a highest point and a lowest point of a bottom surface of the membrane 120. The backplate 130 may be substantially flat at the portion 132. In other words, the step height $h_b$ of the portion 132 may be zero. The highest point of the membrane 120 at the corrugation 122 can be at the flat part of the membrane 120, and the lowest portion can be at the deepest part of the corrugation 122.

According to some embodiments, the MEMS microphone 100 may further comprise circuit components 150. The circuit components 150 for the MEMS microphone 100 comprise, for example, a conductive contact 152 and a conductive pad 154, but not limited thereto. A material of the contact 152 may be, for example, metal. A thickness of the contact 152 may be, for example, 8,000 Å to 25,000 Å. However, the disclosure is not limited thereto. The pad 154 may, for example, comprise polysilicon and metal thereon. A thickness of the polysilicon may be, for example, 1,000 Å to 4,000 Å. A thickness of the metal may be, for example, 8,000 Å to 25,000 Å. However, the disclosure is not limited thereto.

Now the disclosure is directed to a method for manufacturing a MEMS microphone as described above. The method according to the disclosure comprises following steps. First, a membrane is formed on a substrate. The membrane has a corrugation. Then, a stop layer is formed on the membrane. The stop layer has an opening exposing the corrugation. A temporary filling material is filled through the opening of the stop layer into the corrugation. A backplate is formed over the temporary filling material and the membrane.

Figure 4A:
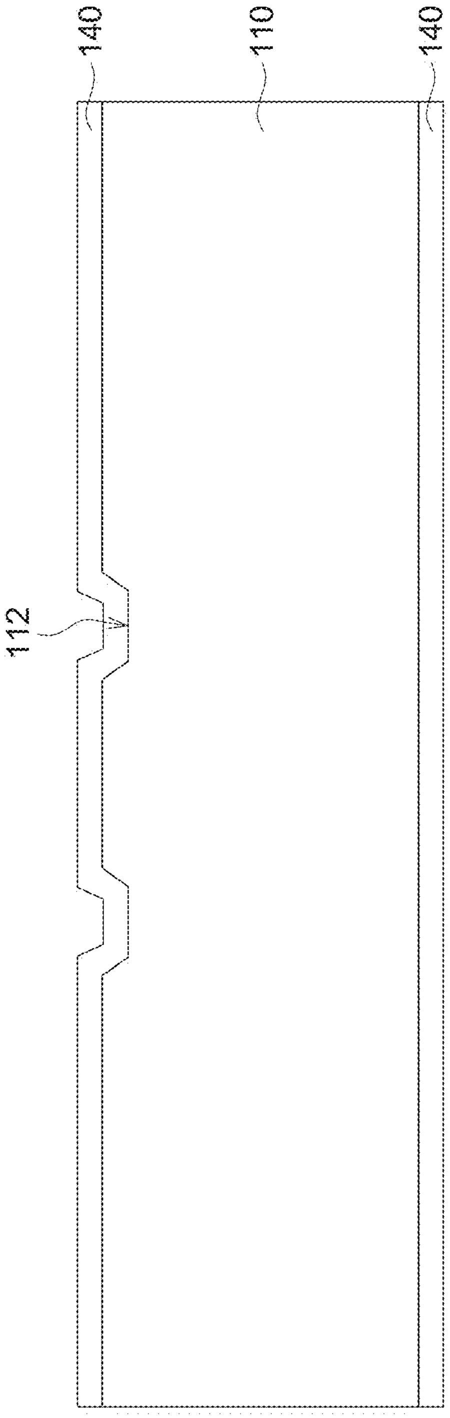
FIGS. 4A-4P illustrate various stages of a method for manufacturing a MEMS microphone according to the disclosure.
Figure 4B:
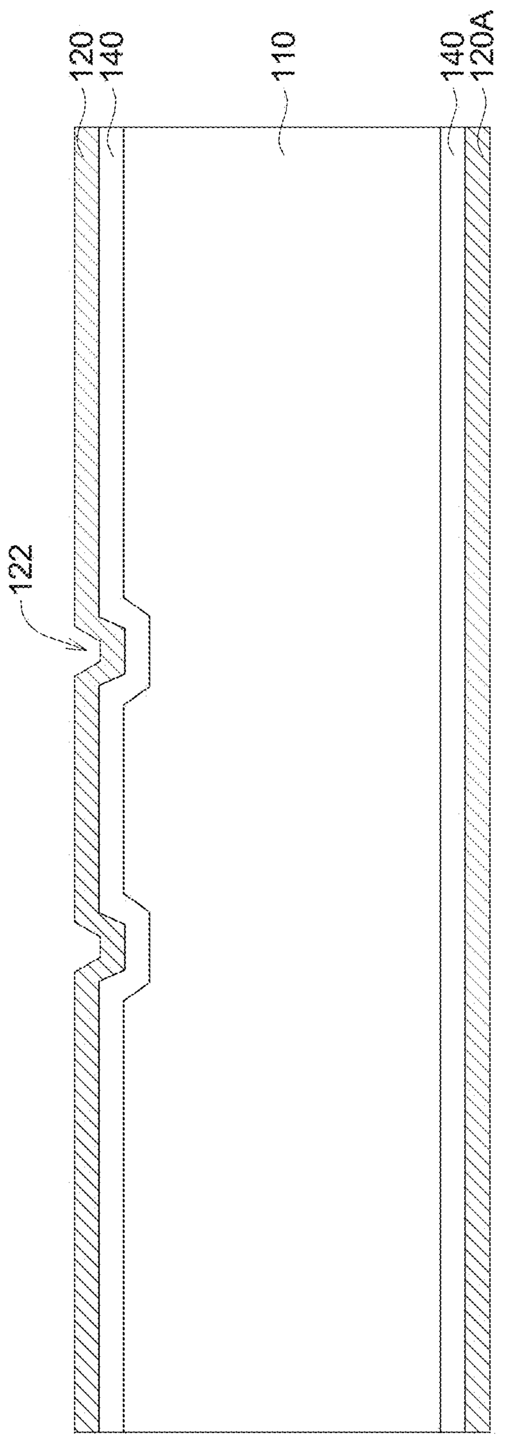
Figure 4C:
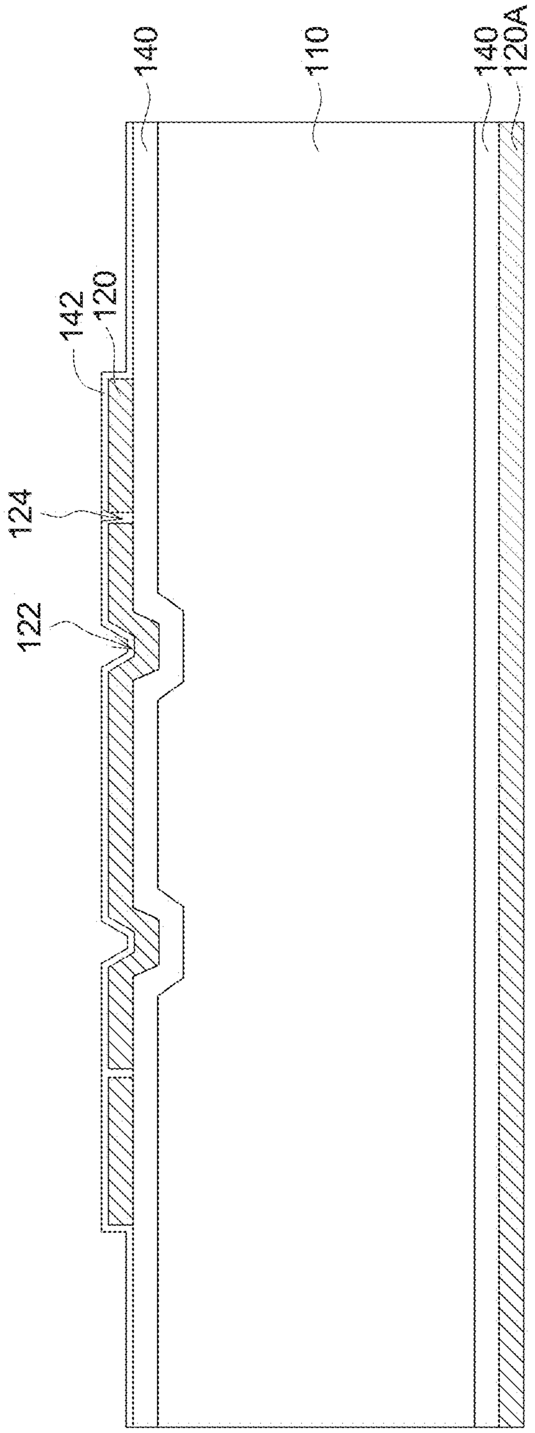
Figure 4D:
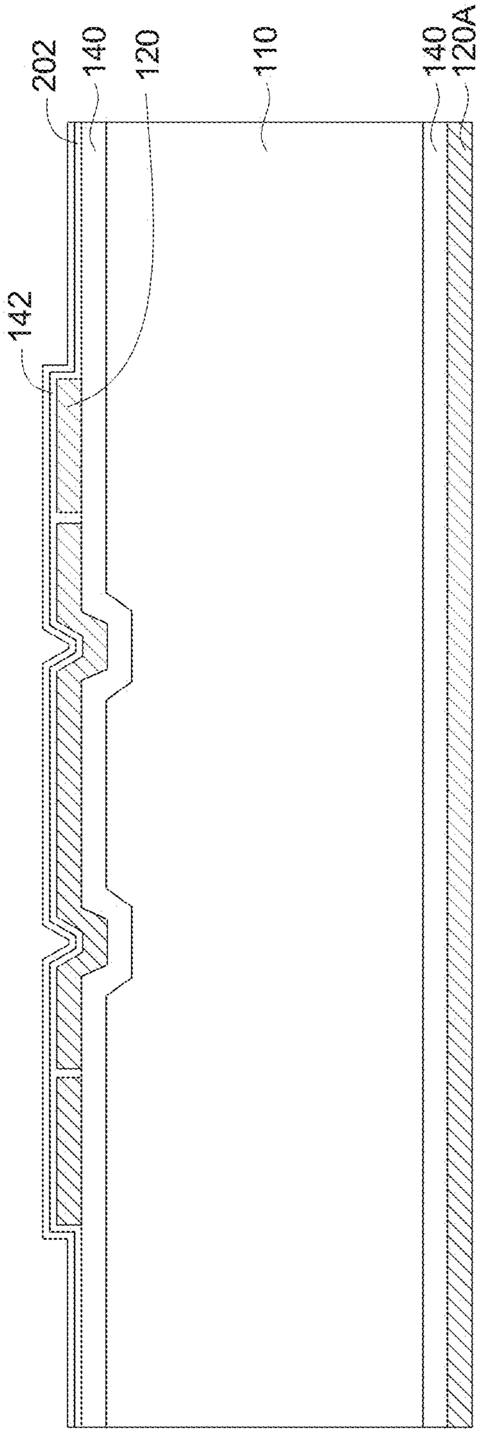
Figure 4E:
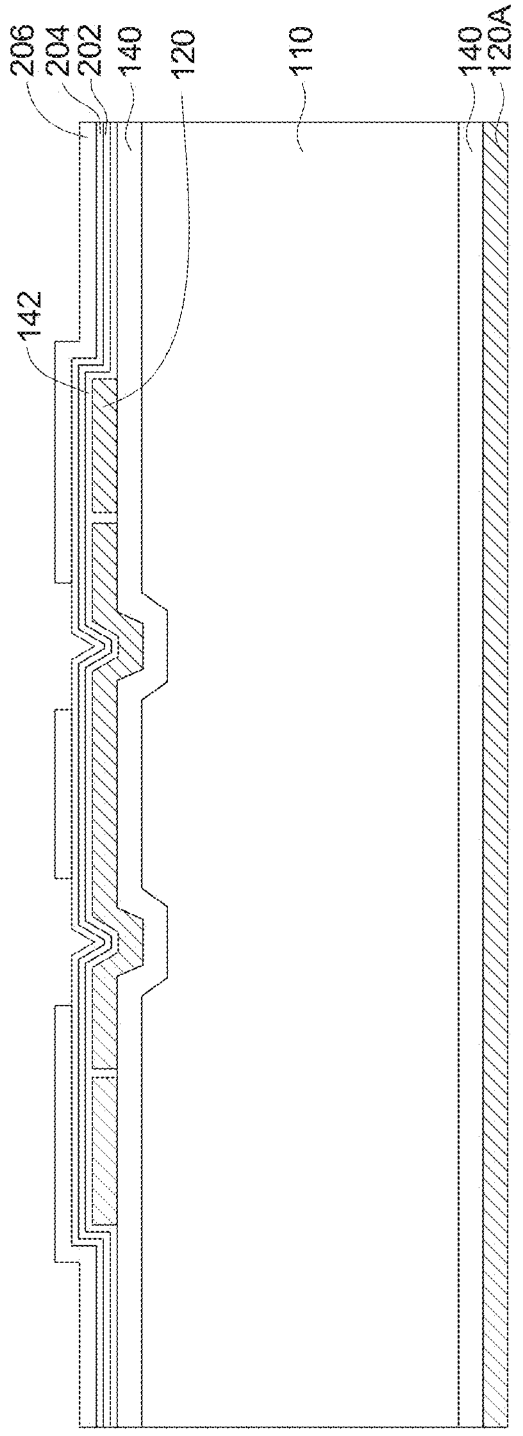
Figure 4F:
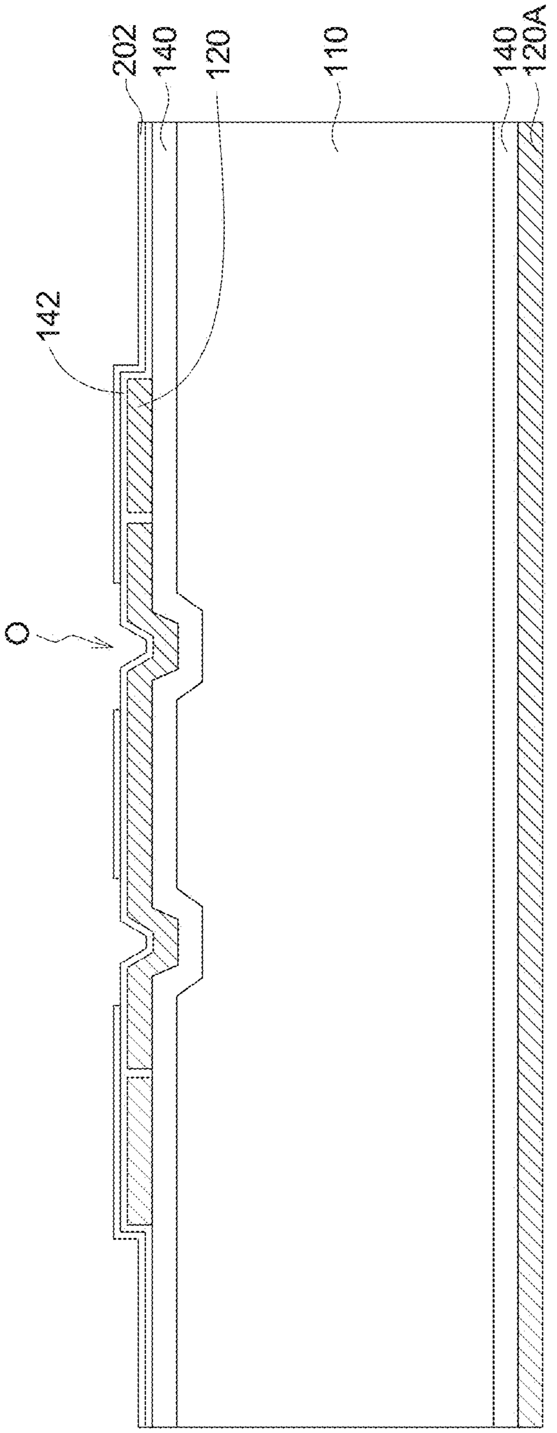
Figure 4G:
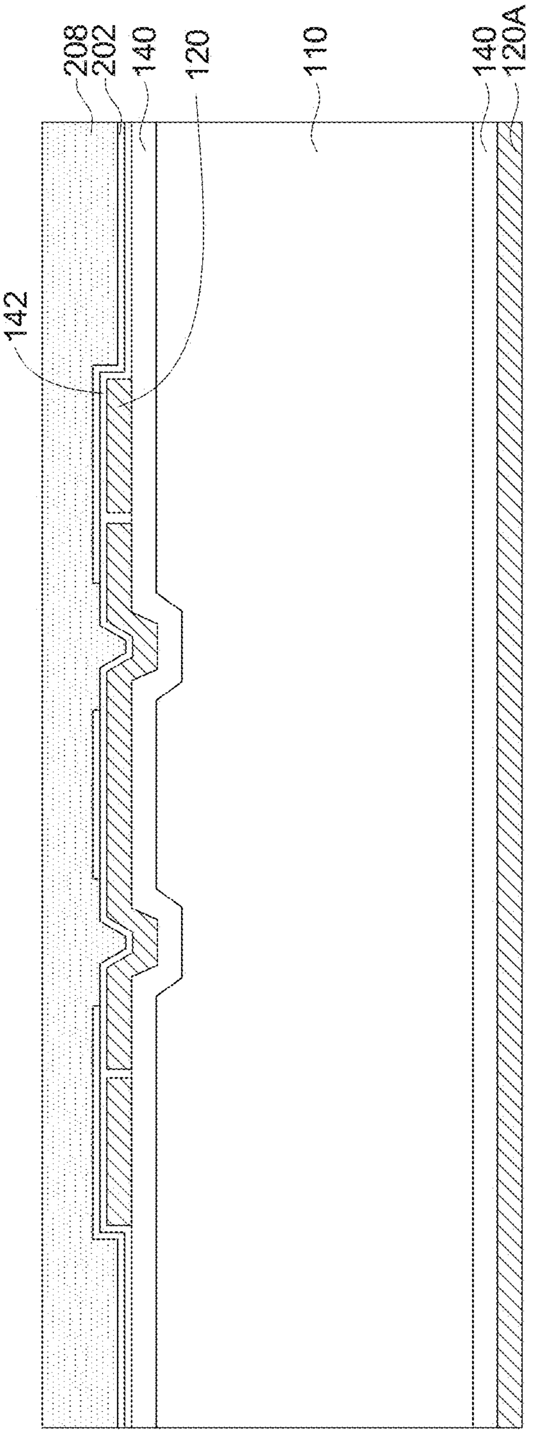
Figure 4H:
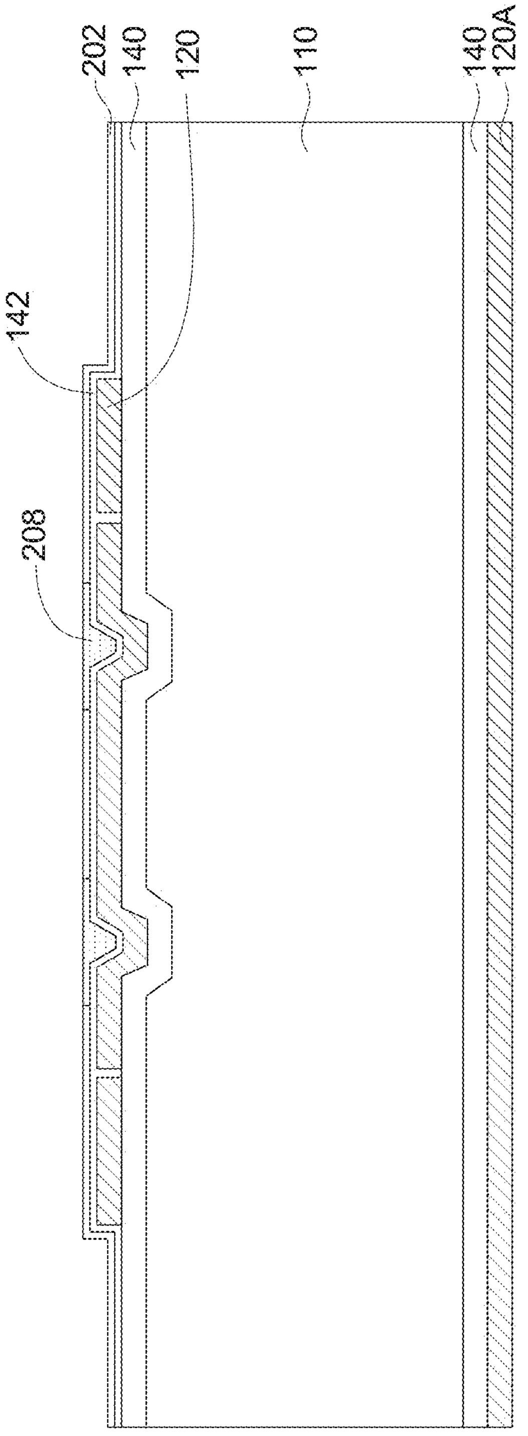
Figure 4I:
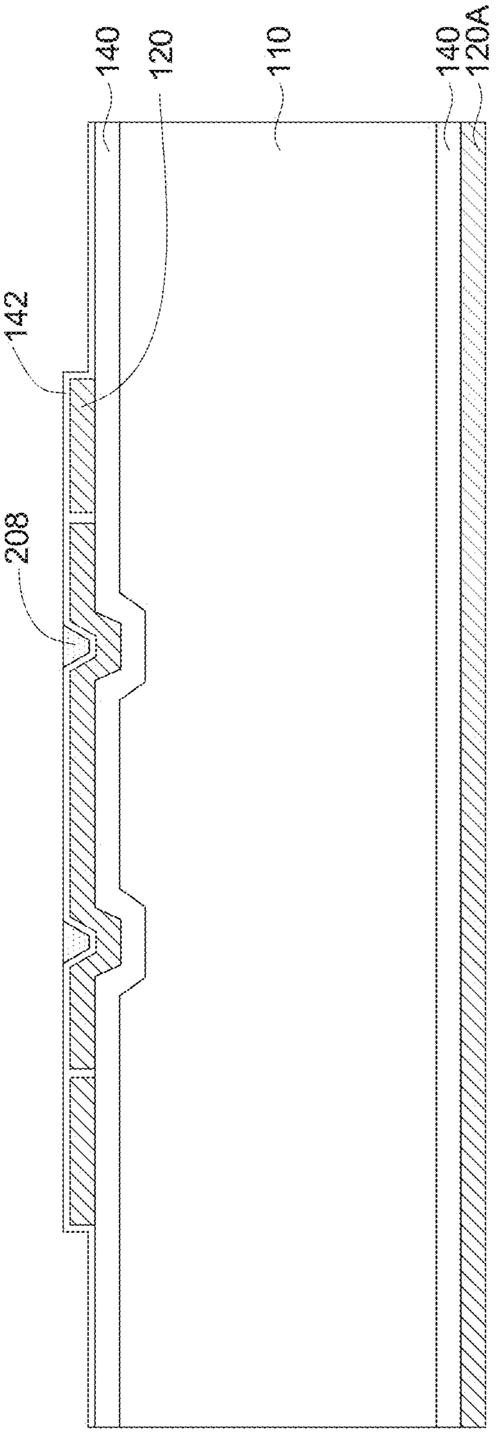
Figure 4J:
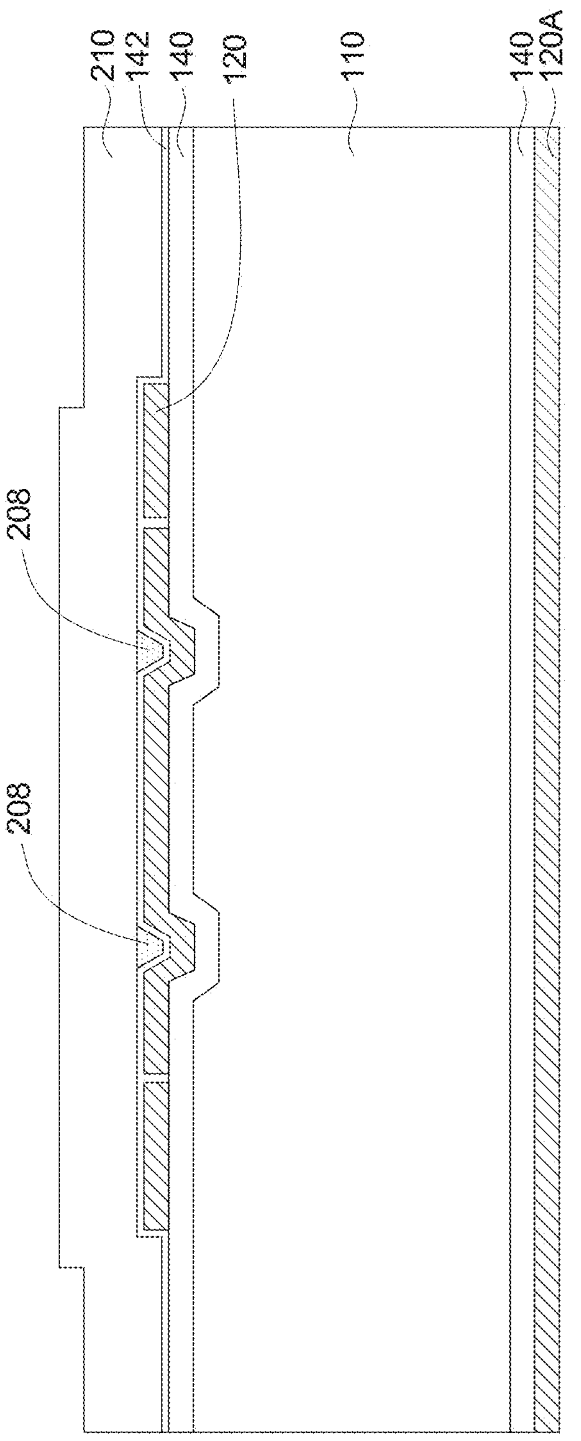
Figure 4K:
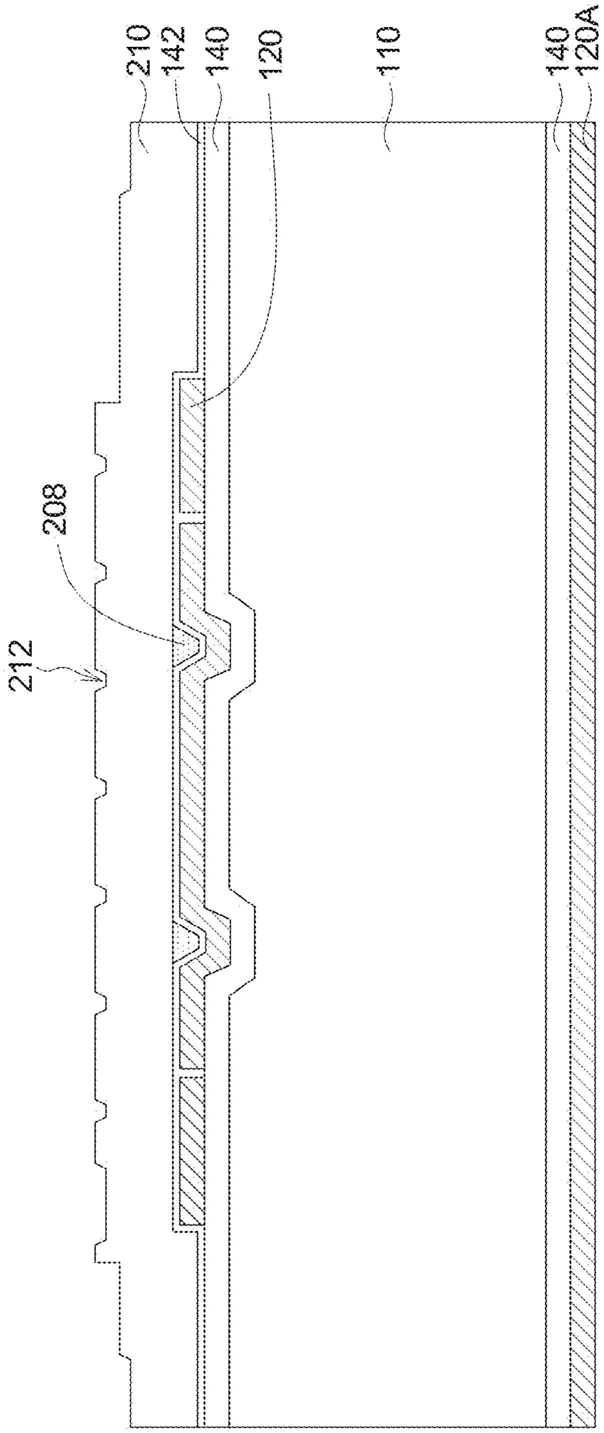
Figure 4L:
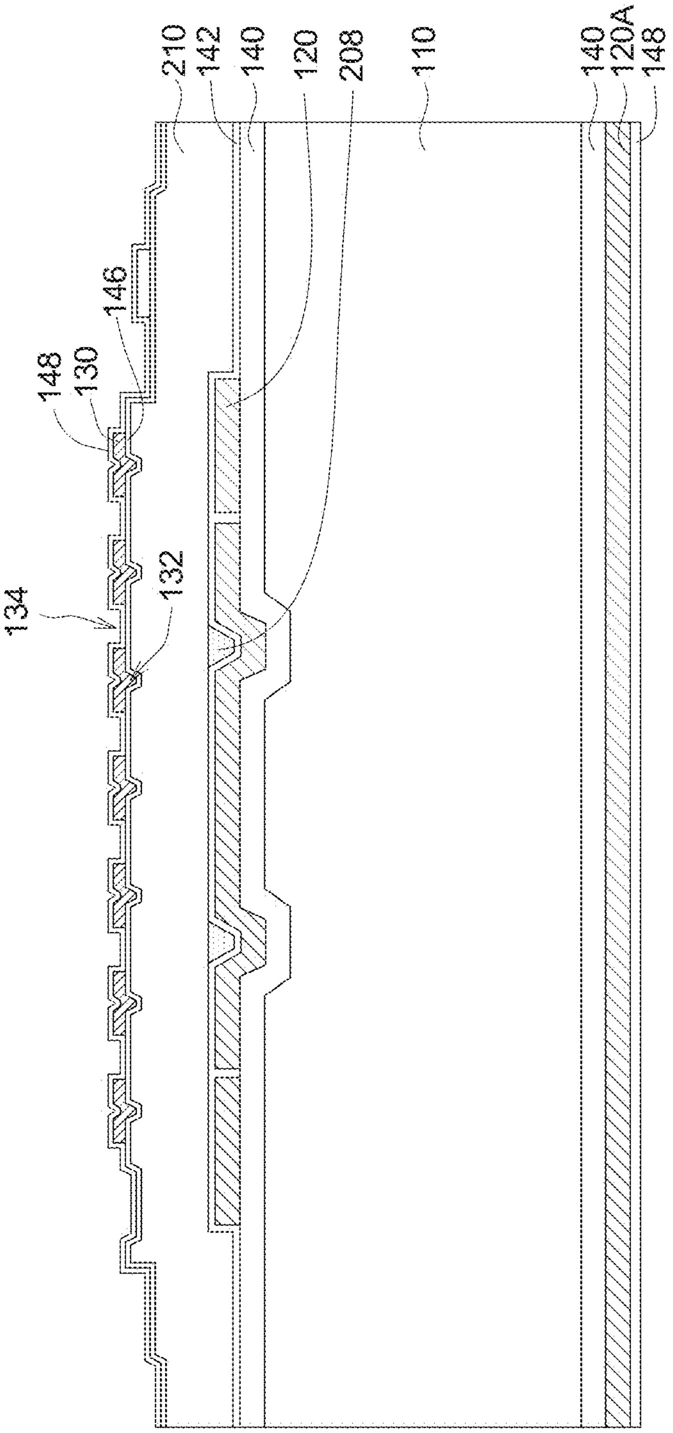
Figure 4M:
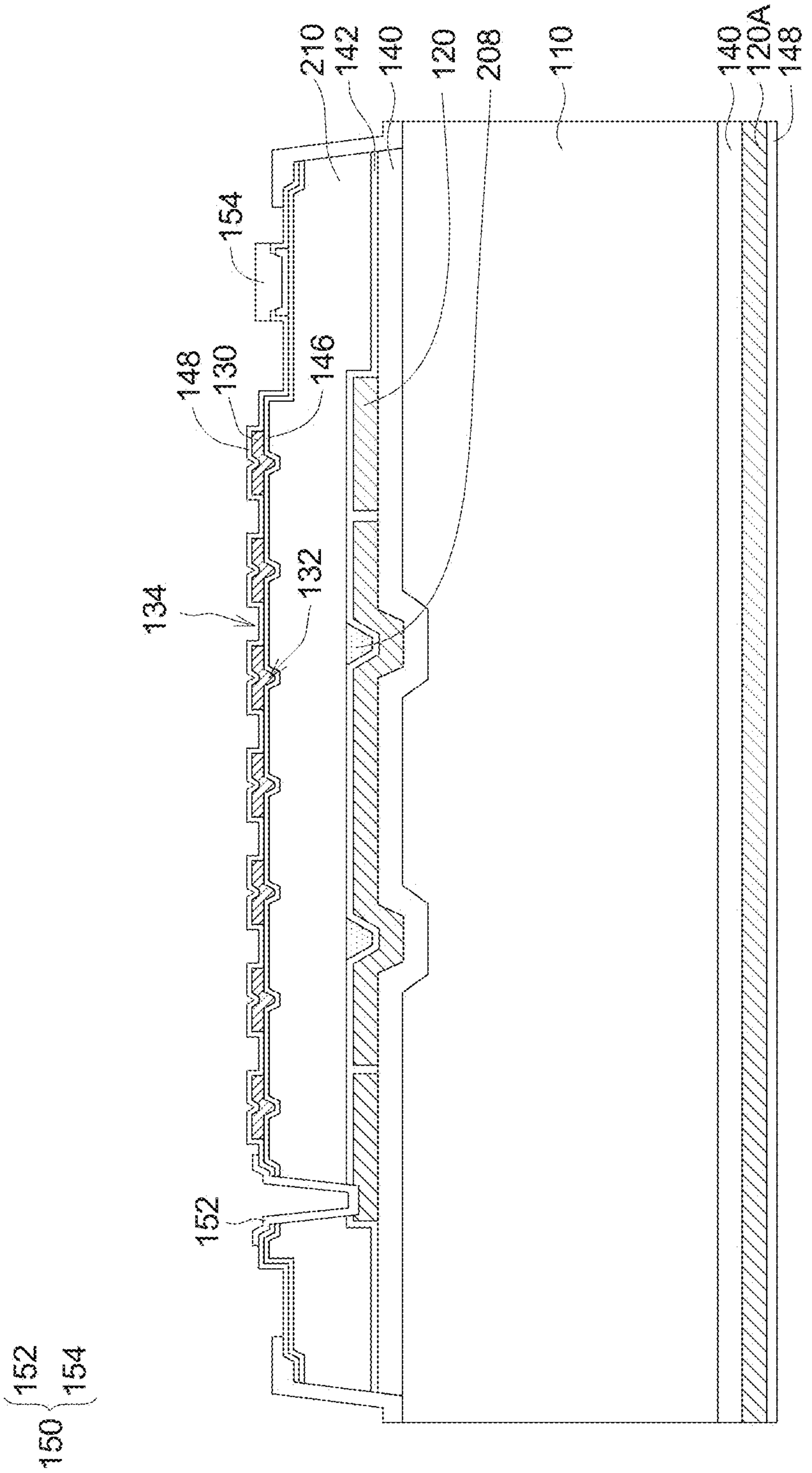
Figure 4N:
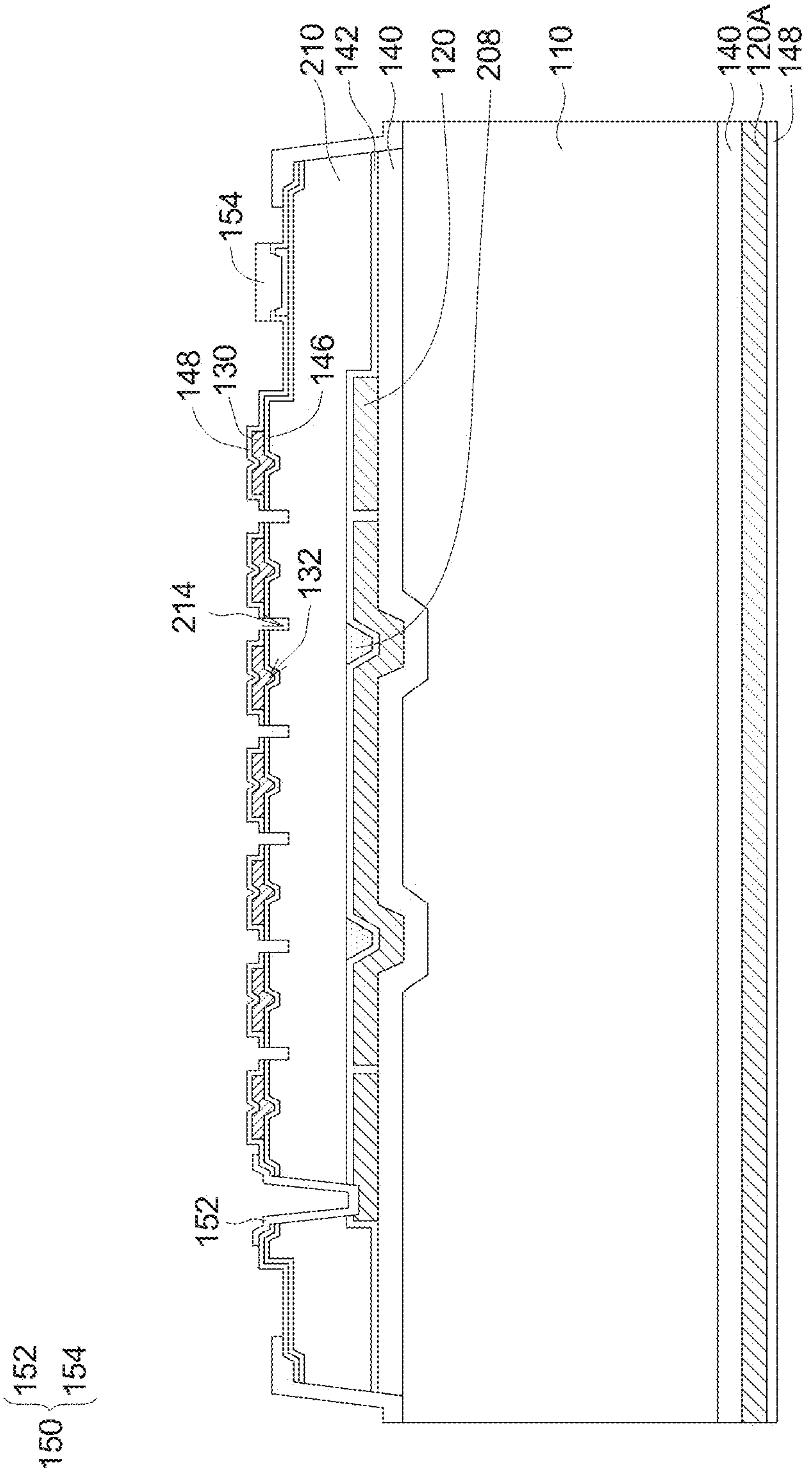
Figure 4O:
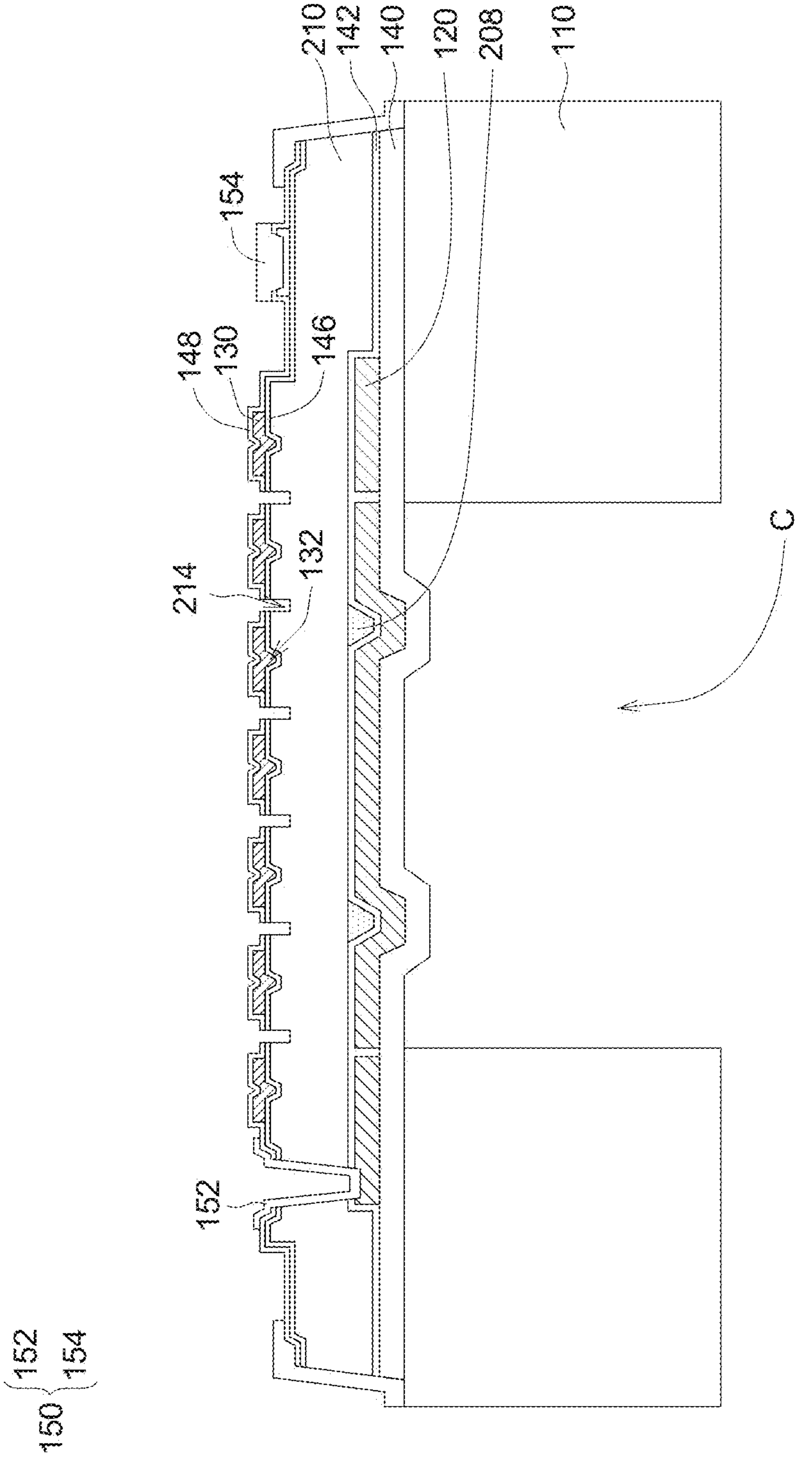
Figure 4P:
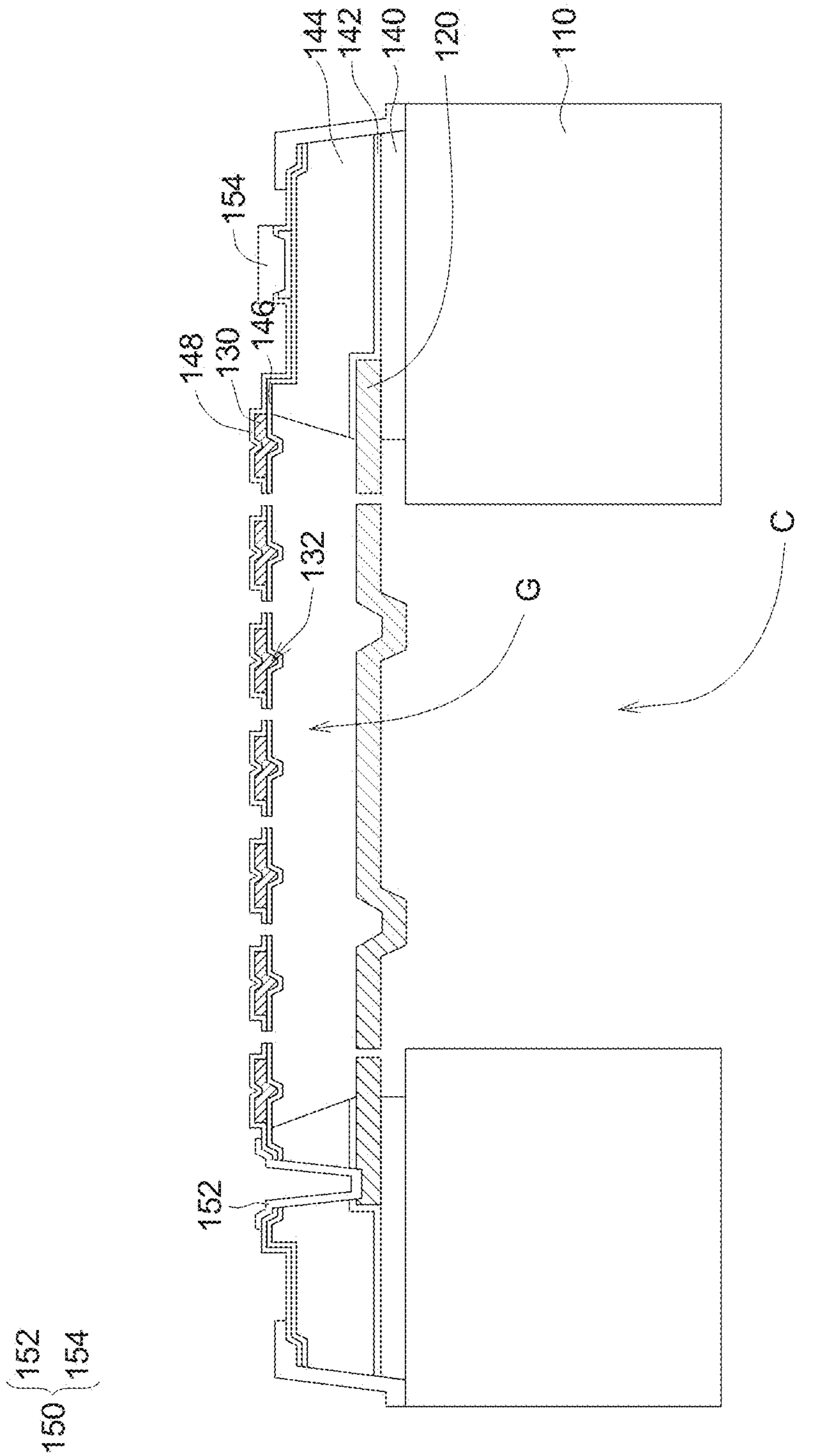

Referring to FIG. 4A-4P for details, various stages of the method for manufacturing the MEMS microphone 100 are shown.

As shown in FIG. 4A, a substrate 110 may be provided at first. The substrate 110 may be formed of silicon. However, the disclosure is not limited thereto. A concave 112 is formed on the substrate 110 at a position corresponding to where a corrugation 122 of a membrane 120 is to be formed.

Then, a dielectric layer 140 may be conformally formed on the substrate 110. The dielectric layer 140 may be formed of oxide. A thickness of the dielectric layer 140 may be 2,000 Å to 10,000 Å. In some embodiments, the dielectric layer 140 may be formed not only on a surface of the substrate 110 at a front-side, but also on a surface of the substrate 110 at a backside. However, the disclosure is not limited thereto.

As shown in FIG. 4B, the membrane 120 is formed on the substrate 110, particularly on the dielectric layer 140 in a conformal manner. The membrane 120 has the corrugation 122. The membrane 120 may be formed of polysilicon. A thickness of the membrane 120 may be 2,000 Å to 10,000 Å. In some embodiments, the material of the membrane 120 is provided also on the dielectric layer 140 at the backside of the substrate 110 to form a layer 120A. However, the disclosure is not limited thereto.

One or more holes 124 are formed through the membrane 120, as shown in FIG. 4C. Then, a dielectric layer 142 may be formed on the membrane 120. A material of the dielectric layer 142 seals the one or more holes 124. The dielectric layer 142 may be formed of TEOS by a low-pressure process. A thickness of the dielectric layer 142 may be 1,000 Å to 2,000 Å. However, the disclosure is not limited thereto.

Thereafter, a stop layer 202 is formed on the membrane 120, particularly on the dielectric layer 142. The stop layer 202 has an opening O exposing the corrugation 122.

Specifically, as shown in FIG. 4D, a stop layer material is formed on the membrane 120, particularly on the dielectric layer 142. The stop layer material is, for example, silicon nitride. However, the disclosure is not limited thereto.

As shown in FIG. 4E, a first mask 204 is formed on the stop layer material. The first mask 204 may be formed of oxide. However, the disclosure is not limited thereto. A second mask 206 is formed on the first mask 204. The second mask 206 may be formed of photo resist. However, the disclosure is not limited thereto. The second mask 206 has an opening corresponding to the corrugation 122 of the membrane 120.

The first mask 204 is etched using the second mask 206. The second mask 206 is removed. Then, the stop layer material is etched using the first mask 204 such that the stop layer 202 has the opening O exposing the corrugation 122. The first mask 204 is removed, as shown in FIG. 4F.

Thereafter, a temporary filling material 208 is filled through the opening O of the stop layer 202 into the corrugation 122. The temporary filling material 208 is, for example, oxide. However, the disclosure is not limited thereto.

Specifically, as shown in FIG. 4G, the temporary filling material 208 is provided on the stop layer 202. The temporary filling material 208 may pass through the opening O of the stop layer 202 and go into the corrugation 122.

Then, as shown in FIG. 4H, a redundant portion of the temporary filling material 208 is removed by a planarization process, such as a CMP process, using the stop layer 202.

As shown in FIG. 4I, the stop layer 202 is removed. In this step, the temporary filling material 208 at the same height may also be removed.

After filling the temporary filling material 208, the temporary filling material 208 forms a substantially flat top surface over the corrugation 122 due to the planarization process. A step height of the substantially flat top surface may be equal to or less than 20% of a step height of the corrugation, and even be zero.

As shown in FIG. 4J, a sacrificial layer 210 is formed on the membrane 120. The sacrificial layer 210 may be formed of oxide. A thickness of the sacrificial layer 210 may be 15,000 Å to 30,000 Å. However, the disclosure is not limited thereto.

As shown in FIG. 4K, concaves 212 are formed on the sacrificial layer 210 at positions corresponding to dimples 134 of a backplate 130. The concaves 212 may be formed by a lithography process and/or an etching process. However, the disclosure is not limited thereto.

Thereafter, the backplate 130 may be formed over the temporary filling material 208 and the membrane 120, particularly on the sacrificial layer 210.

Specifically, as shown in FIG. 4L, a dielectric layer 146 may be conformally formed on the sacrificial layer 210. The dielectric layer 146 may be formed of silicon nitride. A thickness of the dielectric layer 146 may be 1,000 Å to 3,000 Å. However, the disclosure is not limited thereto. The backplate 130 is formed on the sacrificial layer 210, particularly on the dielectric layer 146. The backplate 130 has a plurality of dimples 134 in the concaves 212 and a plurality of acoustic holes 136 through the backplate 130. The backplate 130 may be formed of polysilicon. A thickness of the backplate 130 may be 1,000 Å to 4,000 Å. However, the disclosure is not limited thereto. Then, a protective layer 148 may be conformally formed on the backplate 130. The protective layer 148 may be formed of silicon nitride. A thickness of the protective layer 148 may be 1,000 Å to 3,000 Å. In some embodiments, the may be formed also on the layer 120 A at the backside of the substrate 110. However, the disclosure is not limited thereto.

As shown in FIG. 4M, circuit components 150 for the MEMS microphone 100 may be formed. The circuit components 150 for the MEMS microphone 100 comprise, for example, a conductive contact 152 and a conductive pad 154, but not limited thereto. For example, a hole may be formed around the backplate 130 through the protective layer 148, the sacrificial layer 210, and the dielectric layer 142 to the membrane 120, and metal of 8,000 Å to 25,000 Å thick may be deposited on a sidewall of the hole, so as to form the contact 152. A polysilicon layer of 1,000 Å to 4,000 Å thick and exposed by the protective layer 148 may be formed around the backplate 130 when the backplate 130 is formed, and metal of 8,000 Å to 25,000 Å thick may be deposited on the polysilicon layer, so as to form the pad 154. However, the disclosure is not limited thereto.

As shown in FIG. 4N, holes 214 are formed extending into the sacrificial layer 210 from the acoustic holes 136. The holes 214 may be formed by a lithography process and/or an etching process. However, the disclosure is not limited thereto.

As shown in FIG. 4O, the substrate 110 is thinned from the backside of the substrate 110. In this process, the dielectric layer 140, the layer 120A, and the protective layer 148 at the backside of the substrate 110 are also removed. Then, a cavity C is formed in the substrate 110. The cavity C may be formed by a lithography process and/or an etching process. However, the disclosure is not limited thereto.

As shown in FIG. 4P, an air gap G is formed between the backplate 130 and the membrane 120. Specifically, a portion of the dielectric layer 140 and a portion of the dielectric layer 142 that are between the sacrificial layer 210 and the cavity C, including a portion of the dielectric layer 142 in the holes 124, may be removed from the cavity C using, for example, HF. Then, the HF removes a portion of the sacrificial layer 210 between the backplate 130 and the membrane 120 though the cavity C and the holes 124 to form the air gap G. A redundant portion of the sacrificial layer 210 is the dielectric layer 144 as described above.

In the method according to the disclosure, the corrugation 122 has been filled with the temporary filling material 208 and thus the contour of the membrane 120 is flatten before forming the sacrificial layer 210. As such, a sharp profile caused due to the process transformation can be prevented from being formed in the backplate. Specifically, the backplate 130 has a portion 132 (shown in FIG. 1) corresponding to and directly above the corrugation 122, and a step height of the portion 132 is equal to or less than 20% of a step height of the corrugation, and even may be zero. Therefore, damage of the device caused by stress concentration can be prevented or at least decreased. In addition, since the backplate 130 is not affected by the corrugation 122 of the membrane 120, the design of the membrane 120 can have more flexibility.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A micro-electro-mechanical systems (MEMS) microphone, comprising:

a substrate with a cavity;

a membrane disposed on the substrate across the cavity; and a backplate disposed over the membrane and separated from the membrane by an air gap;

wherein the membrane has a corrugation and a flat part connecting to the corrugation, the backplate has a portion corresponding to and directly above the corrugation, and a step height of the portion is equal to or less than 20% of a step height of the corrugation.

2. The MEMS microphone according to claim 1, wherein the membrane comprises two or more of the corrugations.

3. The MEMS microphone according to claim 1, wherein the backplate comprises a plurality of dimples facing the membrane and a plurality of acoustic holes.

4. The MEMS microphone according to claim 1, wherein the step height of the portion is a vertical distance between a highest point and a lowest point of a top surface of the backplate, and the step height of the corrugation is a vertical distance between a highest point and a lowest point of a top surface of the membrane.

5. The MEMS microphone according to claim 1, wherein the step height of the portion is a vertical distance between a highest point and a lowest point of a bottom surface of the backplate, and the step height of the corrugation is a vertical distance between a highest point and a lowest point of a bottom surface of the membrane.

6. The MEMS microphone according to claim 1, wherein the step height of the portion is zero.

* * * * *